(12) United States Patent
Pyo et al.

(10) Patent No.: US 10,768,462 B2
(45) Date of Patent: Sep. 8, 2020

(54) IN-CELL TOUCH LIQUID CRYSTAL DISPLAY DEVICE AND METHOD OF MANUFACTURING THE SAME

(71) Applicant: LG DISPLAY CO., LTD., Seoul (KR)

(72) Inventors: Jongsang Pyo, Paju-si (KR); Chulsang Shin, Paju-si (KR); Jeheon Cha, Gyeongsan-si (KR)

(73) Assignee: LG DISPLAY CO., LTD., Seoul (KR)

( * ) Notice: Subject to any disclaimer, the term of this patent is extended or adjusted under 35 U.S.C. 154(b) by 40 days.

(21) Appl. No.: 15/720,516

(22) Filed: Sep. 29, 2017

(65) Prior Publication Data

US 2018/0095318 A1     Apr. 5, 2018

(30) Foreign Application Priority Data

Sep. 30, 2016     (KR) .................. 10-2016-0126898

(51) Int. Cl.
| | | |
|---|---|---|
| *G02F 1/1333* | (2006.01) | |
| *G02F 1/1343* | (2006.01) | |
| *G06F 3/041* | (2006.01) | |
| *G02F 1/1335* | (2006.01) | |
| *H01L 27/12* | (2006.01) | |
| *G06F 3/044* | (2006.01) | |
| *G06F 1/16* | (2006.01) | |

(52) U.S. Cl.
CPC ........ *G02F 1/13338* (2013.01); *G02F 1/1343* (2013.01); *G02F 1/133514* (2013.01); *G06F 1/1626* (2013.01); *G06F 1/1637* (2013.01); *G06F 1/1643* (2013.01); *G06F 3/044* (2013.01); *G06F 3/0412* (2013.01); *H01L 27/1214* (2013.01); *G06F 2203/04103* (2013.01); *G06F 2203/04107* (2013.01)

(58) Field of Classification Search
CPC .................. G06F 3/044; G06F 3/0412; G06F 2203/04107; G06F 2203/04103; G06F 1/1637; G06F 1/1626; G06F 1/1643; G02F 1/13338; G02F 1/1343; G02F 1/133514; H01L 27/1214

See application file for complete search history.

(56) References Cited

U.S. PATENT DOCUMENTS

| | | | |
|---|---|---|---|
| 2012/0293490 A1 | 11/2012 | Yang et al. | |
| 2013/0032804 A1* | 2/2013 | Kim ...................... | H01L 27/326 257/59 |
| 2013/0285970 A1* | 10/2013 | Ahn ........................ | G06F 3/044 345/173 |

(Continued)

FOREIGN PATENT DOCUMENTS

| | | |
|---|---|---|
| CN | 1512226 A | 7/2004 |
| CN | 1716015 A | 1/2006 |
| CN | 101950226 A | 1/2011 |

(Continued)

*Primary Examiner* — Yaron Cohen
(74) *Attorney, Agent, or Firm* — Birch, Stewart, Kolasch & Birch, LLP

(57) ABSTRACT

An in-cell touch LCD device and a method of manufacturing the same are discussed. The in-cell touch LCD device may implement a screen display and a screen touch through a thin-film transistor substrate, which has an area larger than that of a color filter substrate, thus improving touch performance and ESD performance and simplifying a manufacturing process and reducing manufacturing costs.

20 Claims, 8 Drawing Sheets

(56) References Cited

U.S. PATENT DOCUMENTS

2016/0306472 A1* 10/2016 Park ................... G06F 3/0412

FOREIGN PATENT DOCUMENTS

| | | |
|---|---|---|
| CN | 102914919 A | 2/2013 |
| CN | 103290802 A | 9/2013 |
| CN | 103294317 A | 9/2013 |
| CN | 104656330 A | 5/2015 |
| CN | 104698636 A | 6/2015 |
| CN | 104749805 A | 7/2015 |
| CN | 104808375 A | 7/2015 |
| CN | 105739753 A | 7/2015 |
| CN | 105158937 A | 12/2015 |
| CN | 105320332 A | 2/2016 |
| CN | 106981252 A | 7/2017 |
| TW | 201423537 A | 6/2014 |
| TW | 201604734 A | 2/2016 |

* cited by examiner (RELATED ART)

IN-CELL TOUCH LIQUID CRYSTAL DISPLAY DEVICE AND METHOD OF MANUFACTURING THE SAME

CROSS-REFERENCE TO RELATED APPLICATION

This application claims the priority benefit of Korean Patent Application No. 10-2016-0126898, filed on Sep. 30, 2016, in the Korean Intellectual Property Office, all of which is fully incorporated by reference into the present application.

BACKGROUND

1. Technical Field

The present disclosure relates to a liquid crystal display device, and more particularly, to an in-cell touch liquid crystal display device and a method of manufacturing the in-cell touch liquid crystal display device.

2. Description of the Related Art

Recently, various types of flat panel display devices that enable the weight and volume of display devices to be reduced have been developed, in view of the disadvantages of Cathode Ray Tubes (CRTs). Examples of such flat panel display devices may include a Liquid Crystal Display (LCD), a Field Emission Display (FED), a Plasma Display Panel (PDP), an electroluminescence (EL) Device, etc.

Since these flat-panel display devices are thin and lightweight, they have widely been used as display means in mobile communication terminals or portable information processors. In particular, in portable or mobile devices, requirements for display panels that are thinner and lighter and have lower power consumption have increased.

A flat-panel display device displays an image using a gate drive circuit for supplying scan signals to gate lines of a display panel and a data drive circuit for supplying data voltages to data lines. For example, a data driver coupled to data lines of the display panel may be arranged on one side of an upper portion of the display panel in a Tape Automated Bonding (TAB) manner. Further, a gate driver coupled to gate lines of the display panel may be arranged on one side of a left portion of the display panel in a TAB manner.

In a method for configuring the gate driver and the data driver separately from the display panel and coupling them to the display panel, a mounting area is needed, and thus a bezel area that is the border area of the display panel inevitably occupies a large portion. As demands for flat-panel display devices have increased, and technology related to flat-panel display devices has been developed, the exterior designs or various requirements of flat-panel display devices in esthetical aspects have increased.

As one of those demands, a demand for a flat-panel display device, which enables black borders occupying four sides of a surface of a flat-panel display device when the flat-panel display device is observed, that is, a bezel area, to be minimized, has increased.

Meanwhile, touch panel technologies have been proposed as technology for operating flat-panel display devices.

A typical touch display panel includes a touch panel and a display unit superimposed on the touch panel. Such a touch panel is designed as an operation interface.

The touch panel is so transparent that an image generated by the display unit may be directly visible to a user without being hidden by the touch panel. In this way, the touch panel is so transparent that the image may be directly visible to the user.

The above-described general touch panel technology, however, may cause the weight and thickness of a touch display panel to be increased, a light penetration ratio to be decreased, and the reflectivity and haze ratio of the touch display panel to be increased.

As a result, on-cell and in-cell touch technologies have been proposed to address the disadvantageous of the above-described existing touch technologies.

One of the on-cell technologies is to form a complete color filter substrate by arranging a sensor on a rear surface of the color filter substrate.

Further, another one of the on-cell technologies is to arrange a touch sensor on a thin film, and attach the thin film to a thin-film transistor substrate of two substrates.

In addition, the in-cell technologies are configured to arrange a sensor in a cell structure of a liquid crystal display panel. Currently, there are three major in-cell technologies, that is, resistive, capacitive, and optical touch technologies. The resistive touch technology uses voltage variation of two conductive substrates and a common electrode interposed between the two substrates in order to determine a touch position on a touch display panel.

An in-cell touch LCD device using such in-cell touch technology according to a related art will be described below with reference to FIGS. 1 and 2.

FIG. 1 is a schematic sectional view of an in-cell touch LCD device according to the related art.

FIG. 2 is a diagram schematically illustrating a structure in which data lines and touch lines of the in-cell touch LCD device of FIG. 1 are arranged not to alternate with each other in a Non-Double Rate Driving (non-DRD) form.

Referring to FIG. 1, the in-cell touch LCD device includes a thin-film transistor substrate 11, a color filter substrate 51 disposed over the thin-film transistor substrate 11 to be spaced apart from the thin-film transistor substrate 11 by a predetermined interval, and a liquid crystal layer 61 formed between the thin-film transistor substrate 11 and the color filter substrate 51.

Here, a first protective layer 23 is formed on an entire surface of the substrate including the thin-film transistor (not illustrated), and a planarization layer 25 is formed on the first protective layer 23.

A pixel electrode 27 that is electrically coupled with the thin-film transistor is formed on the planarization layer 25.

Touch lines 29 are formed on a second protective layer 28 disposed on the planarization layer 25.

Further, a plurality of common electrodes 35 that overlap the pixel electrode 27 and that are coupled with the touch lines 29 are formed on an interlayer insulating layer 31 disposed on the second protective layer 28.

Meanwhile, a black matrix 53 for blocking the transmission of light to an area other than a pixel area is formed on the color filter substrate 51 disposed over the thin-film transistor substrate 11, and red, green and blue color filters 55 are formed in the pixel area of the color filter substrate 51.

Further, a transparent conductive layer 57 having a high resistance value is formed on the entire surface of the color filter substrate 51 in order to implement touch performance by touching the surface of the color filter substrate 51. Here, the conductive layer 57 is used as a touch material layer that replaces existing Indium Tin Oxide (ITO) having a low resistance value so as to prevent static electricity with a finger capacitor from occurring.

Furthermore, the liquid crystal layer 61 is interposed between the thin-film transistor substrate 11 and the color filter substrate 51 which are attached to each other.

Referring to FIGS. 1 and 2, the in-cell touch LCD device according to the related art is configured in a non-alternating (non-Double Rate Driving (non-DRD) structure, and the data lines 21 and the touch lines 29 overlap each other.

Also, since the in-cell touch LCD device according to the related art uses the entire surface of the color filter substrate 51 as a touch surface, the conductive layer 57 having a high resistance value is formed on the entire surface of the color filter substrate 51 in order to form finger capacitance and an Electrostatic Discharge (ESD) path.

In addition, since the in-cell touch LCD device according to the related art has a structure in which the touch lines 29 overlap the data lines 21, the planarization layer 25 is further formed between the data lines 21 and the touch lines 29 in order to reduce the resistance (load) of the touch lines 29.

In the in-cell LCD device implemented using the above configuration according to the related art, touch performance is implemented by touching one surface of the color filter substrate 51 using the high-resistance conductive layer 57.

A mask manufacturing process for the in-cell touch LCD device having the above-described configuration will be schematically described below with reference to FIG. 3 according to the related art.

FIG. 3 is a flowchart illustrating a mask manufacturing process for the in-cell touch LCD device of FIG. 1.

Referring to FIG. 3, the mask manufacturing process according to the related art for the in-cell touch LCD device of FIG. 1 includes a first mask process S11 of forming a gate line and a gate electrode, a second mask process S12 of forming an active layer, a source electrode, and a drain electrode, a third mask process S13 of forming a drain electrode contact hole for exposing the drain electrode, a fourth mask process S14 of forming a pixel electrode electrically coupled with the drain electrode, a fifth mask process S15 of forming a touch line that vertically overlaps the data line, a sixth mask process S16 of forming a touch line contact hole in an interlayer insulating layer, and a seventh mask process S17 of forming a common electrode that overlaps the pixel electrode and is coupled with the touch line.

In this way, after the mask manufacturing process for the in-cell touch LCD device according to the related art has been performed, one surface of the color filter substrate 51 is coated with a transparent conductive layer having a high resistance value (see 57 in FIG. 1) in order to implement touch performance by touching the one surface of the color filter substrate 51. At this time, the conductive layer 57 is coated under an additional external manufacturing process system, separately from processes for manufacturing the thin-film transistor substrate and the color filter substrate.

FIG. 4 is a diagram schematically illustrating an Electrostatic Discharge (ESD) path of the in-cell touch LCD device of FIG. 1.

Referring to FIG. 4, in the in-cell touch LCD device according to the related art, static electricity that is externally produced is discharged to the outside of the LCD device through the conductive layer 57 having a high resistance value, a silver (Ag) dotting part 91, ground 81, etc.

In this way, according to the in-cell touch LCD device of the related art, the rear surface of the color filter substrate is coated with a conductive layer having a high resistance value under an additional external manufacturing process system, separately from processes for manufacturing the thin-film transistor substrate and the color filter substrate, and thus coating spots attributable to an organic material on the rear surface of the color filter substrate are caused.

Therefore, in the related art, since a separate etching and cleaning process or the like is additionally required so as to eliminate such coating spots, the number of manufacturing processes may be increased due to the additionally required process.

Also, in the related art, since a transparent conductive layer having a high resistance value, instead of existing ITO, is formed on the color filter substrate, electrostatic spots occur due to the transparent conductive layer, so that ESD prevention characteristics are decreased, and thus a yield and touch sensitivity are deteriorated.

Further, since a distance (see d1 of FIG. 1) between a finger and the common electrode is lengthened, the value of finger capacitance (see C1 of FIG. 1) is decreased, and the area of the common electrode is small, thus decreasing touch sensitivity when a finger touch is sensed.

Furthermore, in the related art technology, the touch line is disposed to overlap the data line, thus increasing a touch line resistance (load). To prevent this, a planarization layer is required, so that the number of manufacturing processes is increased.

In particular, since the related art technology employs a structure in which a separate metal layer should be formed to form the touch line and in which the data line overlaps the touch line, a process of forming a thick planarization layer between the data line and the touch line should be added so as to reduce the resistance of the touch line, thus causing the entire manufacturing process to be complicated, and increasing manufacturing costs.

Moreover, when the in-cell touch LCD device is manufactured according to the related art, around seven manufacturing masks are required to form at least a gate, a source/drain, a drain contact hole, a pixel electrode, a touch line, a touch line contact hole, and a common electrode, thus increasing the number of panel manufacturing processes and manufacturing costs in proportion to the number of masks.

SUMMARY OF DISCLOSURE

Various embodiments of the present disclosure are directed to an in-cell touch LCD device and a method of manufacturing the same, in which a screen display and a screen touch are implemented through a thin-film transistor substrate having an area larger than that of a color filter substrate, thus improving touch performance and ESD performance.

Various embodiments of the present disclosure are directed to an in-cell touch LCD device and a method of manufacturing the same, in which an existing high-resistance transparent conductive layer, which was used to make a touch, is removed by employing a four-side borderless configuration/design, thus simplifying manufacturing processes and reducing manufacturing costs.

Various embodiments of the present disclosure are directed to an in-cell touch LCD device and a method of manufacturing the same, which increase finger capacitance by reducing a distance between a finger and a common electrode, thereby improving touch sensitivity when a finger touch is sensed, and enhancing ESD characteristics.

Various embodiments of the present disclosure are directed to an in-cell touch LCD device and a method of manufacturing the same, in which a resistor is added to a ground line of a printed circuit board coupled with an ESD path of a panel, so that, even if ITO is applied to a rear surface of a color filter substrate, touch performance may be ensured and ESD characteristics may be improved.

In an embodiment of the present disclosure, a borderless in-cell touch LCD device may include a lower substrate, a an upper substrate disposed over the lower substrate to face the lower substrate, the upper substrate having an area larger than that of the lower substrate, and a liquid crystal layer interposed between the upper substrate and the lower substrate.

The in-cell touch liquid crystal display device according to an embodiment of the present disclosure may include a common electrode provided over the upper substrate, a gate line and a data line provided over the upper substrate and disposed to cross each other to define a pixel area, a touch line disposed over the upper substrate in parallel to the data line, a thin-film transistor provided at a crossing point of the gate line and the data line, a protective layer provided over the upper substrate including the thin-film transistor, and configured to expose a portion of a drain electrode of the thin-film transistor and a portion of each of the touch line and the common electrode, a pixel electrode provided over the protective layer and coupled to the drain electrode, and a coupling line coupled to the touch line and the common electrode.

The in-cell touch liquid crystal display device may further include a nitride-based insulating layer provided over the upper substrate below the common electrode.

The common electrode may be formed in a shape of a large-area plate.

The common electrode may be formed over an entire surface of a pixel area formed while the gate line and the data line cross each other.

The lower substrate may be a color filter substrate, and the upper substrate may be a thin-film transistor substrate.

An electrostatic discharge path may be formed through the common electrode and a ground line of a printed circuit board coupled to the common electrode.

The in-cell touch liquid crystal display device may further include a resistor provided on the ground line of the printed circuit board that forms the electrostatic discharge path.

The in-cell touch liquid crystal display device may further include a transparent conductive layer provided on a rear surface of the lower substrate.

An electrostatic discharge path may be formed through the transparent conductive layer, a silver dotting part, and a ground line.

In another embodiment of the present disclosure, a method of manufacturing a borderless in-cell touch LCD device according to the present disclosure may include providing a lower substrate, disposing an upper substrate to face the lower substrate over the lower substrate, the upper substrate having an area larger than that of the lower substrate, and forming a liquid crystal layer between the upper substrate and the lower substrate.

The method of manufacturing the in-cell touch LCD device according to an embodiment of the present disclosure may include forming a common electrode over the upper substrate, forming a gate line and a data line disposed to cross each other to define a pixel area over the upper substrate, forming a touch line disposed in parallel to the data line over the upper substrate, forming a thin-film transistor at a crossing point of the gate line and the data line, forming a protective layer, configured to expose a portion of a drain electrode of the thin-film transistor and a portion of each of the touch line and the common electrode, over the upper substrate including the thin-film transistor, forming a pixel electrode coupled to the drain electrode over the protective layer, and forming a coupling line coupled to the touch line and the common electrode.

The method may further include forming a nitride-based insulating layer over the upper substrate below the common electrode.

The common electrode may be formed in a shape of a large-area plate.

The common electrode may be formed over an entire surface of a pixel area formed while the gate line and the data line cross each other.

The lower substrate may be a color filter substrate, and the upper substrate may be a thin-film transistor substrate.

An electrostatic discharge path may be formed through the common electrode and a ground line of a printed circuit board coupled to the common electrode.

The method may further include providing a resistor on the ground line of the printed circuit board that forms the electrostatic discharge path.

The method may further include forming a transparent conductive layer over a rear surface of the lower substrate.

An electrostatic discharge path may be formed through the transparent conductive layer, a silver dotting part, and a ground line.

The forming of the pixel electrode coupled to the drain electrode over the protective layer and the forming of the coupling line coupled to the touch line and the common electrode may be simultaneously performed through an identical mask process.

The forming of the data line and the forming of the touch line disposed in parallel to the data line over the upper substrate may be simultaneously performed through an identical mask process.

DETAILED DESCRIPTION OF THE EMBODIMENTS

Figure 1:
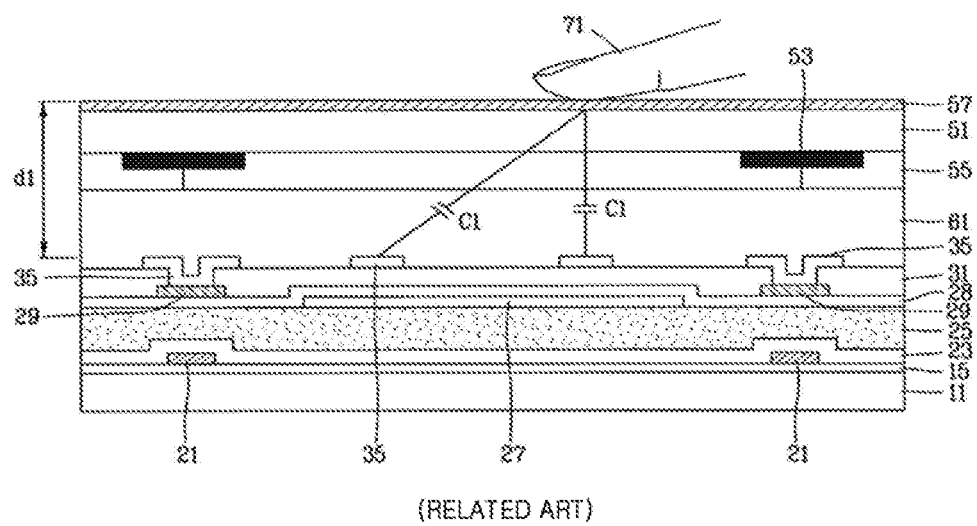
FIG. 1 is a schematic sectional view of an in-cell touch LCD device according to a related art.
Figure 2:
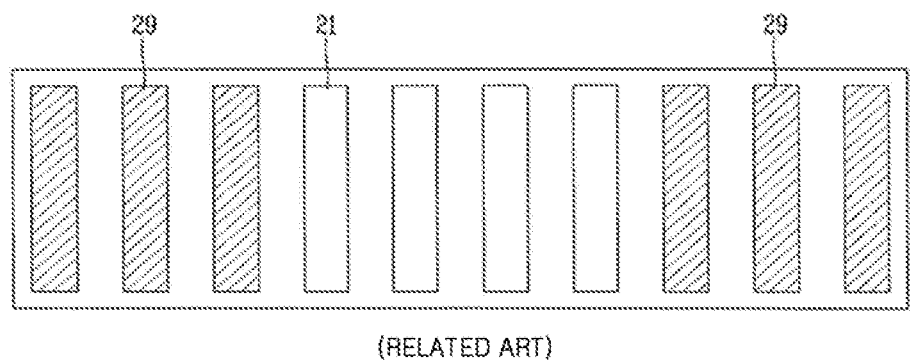
FIG. 2 is a diagram schematically illustrating a structure in which data lines and touch lines of the in-cell touch LCD device of FIG. 1 are arranged in a non-alternating (non-DRD) form.
Figure 3:
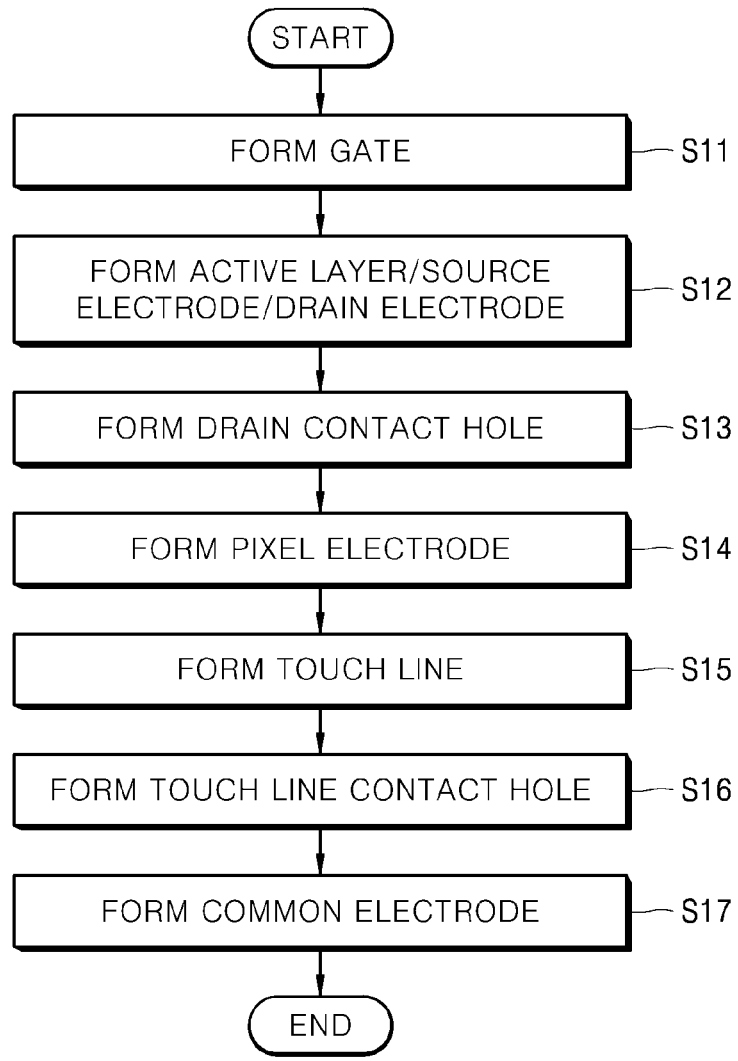
FIG. 3 is a diagram illustrating a mask manufacturing process for the in-cell touch LCD device of FIG. 3.
Figure 4:
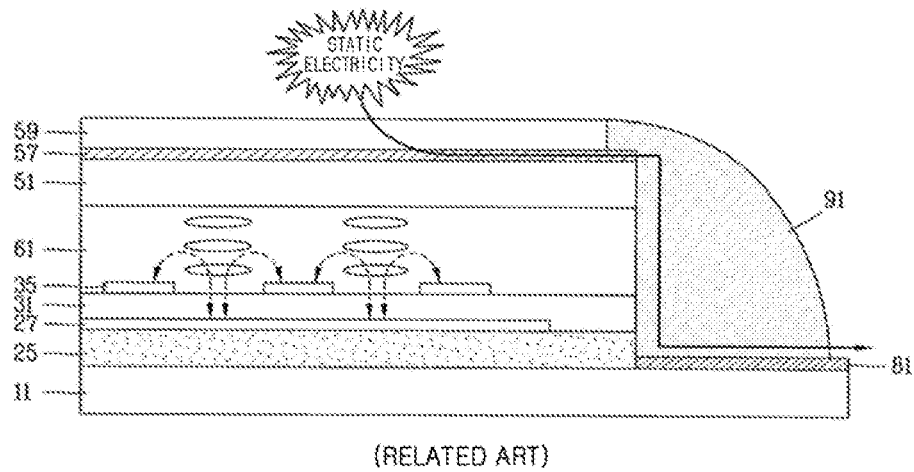
FIG. 4 is a diagram schematically illustrating an ESD path of the in-cell touch LCD device of FIG. 1.

Hereinafter, embodiments of a borderless Liquid Crystal Display (LCD) device according to the present disclosure will be described in detail with reference to the attached drawings so that those skilled in the art to the present disclosure pertains can easily practice the embodiments.

The advantages and features of the present disclosure and methods of achieving them will be more clearly understood from the following detailed description taken in conjunction with the accompanying drawings. However, the present disclosure is not limited by embodiments, which will be disclosed later, but may be implemented in different various forms. The embodiments of the present disclosure are intended to fully describe the present disclosure to a person having ordinary knowledge in the art to which the present disclosure pertains, and are defined only by the accompanying claims. It should be noted that the same reference numerals are used to designate the same or similar elements throughout the entire specification. Accordingly, the sizes and relative sizes of layers and areas in the drawings may be exaggerated to make the description clearer.

An expression indicating that an element or a layer is disposed "on" a certain element or layer includes all cases where an additional layer or element is interposed therebetween, as well as a case where the element or the layer is disposed directly on the certain element or layer. In contrast, an expression indicating that an element is disposed "directly on" or "just on" a certain element means that an additional element or layer is not interposed therebetween.

Further, spatially relative terms, such as "below," "beneath," "lower," "above," and "upper," may be used herein to easily describe correlations between one element or components and an additional element or components, as illustrated in the drawings. The spatially relative terms should be understood to encompass different orientations of an element in use or operation in addition to the orientation depicted in the drawings. For example, if these elements in the drawing are turned over, elements described as being "below" or "beneath" other elements would then be oriented "above" the other elements. Thus, the exemplary term "below" can encompass both an orientation of above and below.

The terms used in the present specification are merely intended to describe specific embodiments and are not intended to limit the present disclosure. In the present specification, a singular expression includes a plural expression unless a description to the contrary is specifically pointed out in context. In the present specification, it should be understood that the terms such as "comprise" and/or "comprising" are merely intended to indicate that features, numbers, steps, operations, components, parts, or combinations thereof are present, and are not intended to exclude a possibility that one or more other features, numbers, steps, operations, components, parts, or combinations thereof will be present or added.

Figure 5:
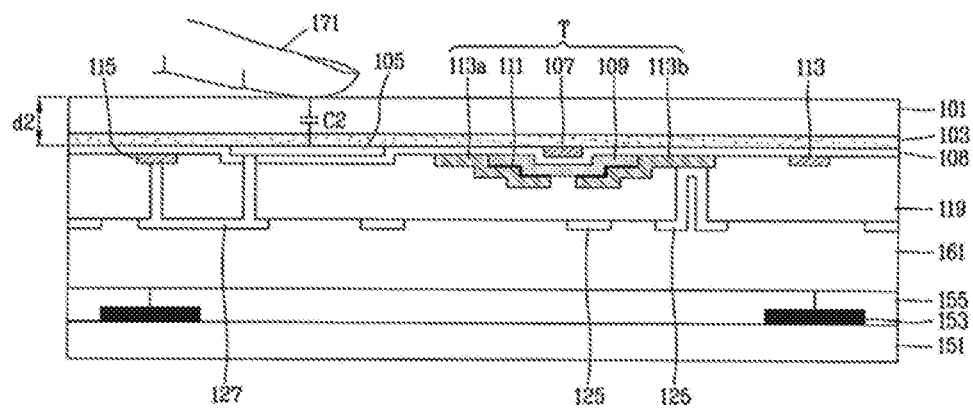
FIG. 5 is a schematic sectional view of a borderless in-cell touch LCD device according to an embodiment of the present disclosure.

FIG. 5 is a schematic sectional view of a borderless in-cell touch LCD device according to an embodiment of the present disclosure. All the components of the in-cell touch LCD device according to all embodiments of the present disclosure are operatively coupled and configured.

Here, FIG. 5 schematically illustrates a part of a Fringe-Field Switching (FFS)-type liquid crystal panel that implements an image in such a way that a fringe field formed between a pixel electrode and a common electrode drives liquid crystal molecules located in a pixel area and on the common electrode after penetrating through a slit. However, the present disclosure is not limited thereto, but may also be applied to an In-Plane Switching (IPS)-type LCD device that uses a lateral electric field, as well as the FFS type.

Referring to FIG. 5, the borderless LCD device according to the present disclosure is characterized in that an upper substrate 101 is implemented as a thin-film transistor substrate, and a lower substrate 151 is implemented as a color filter substrate. That is, the borderless LCD device according to the present disclosure is characterized in that, unlike a related art structure, the upper substrate having a relatively large area is disposed over the lower substrate. Here, on the upper substrate 101, thin-film transistors, which are switching elements, and various types of lines and electrodes are formed to define pixel areas.

Further, a color filter layer 155 for displaying three primary colors such as red (R), green (G), and blue (B), and a black matrix (BM) 153 for partitioning individual pixel areas may be formed on the lower substrate 151. A lower polarizing plate is formed on an outer surface of the lower substrate 151.

That is, a plurality of gate lines and data lines 113 that are horizontally and vertically arranged and that define a plurality of pixel areas, thin-film transistors that are switching elements formed in crossing regions of the gate lines and the data lines 113, and pixel electrodes 125 that are formed in the pixel areas may be formed on the upper substrate 101.

Further, when the LCD device is a vertical electric field type, such as a Twisted Nematic (TN) type, a common electrode is formed on the lower substrate 151, whereas when the LCD device is a horizontal electric field type, such as an In-Plane Switching (IPS) or Fringe-Field Switching (FFS) type, the pixel electrodes 125, together with the common electrode 105, may be formed on the upper substrate 101.

As illustrated in FIG. 5, a nitride-based insulating layer 103 is formed on the upper substrate 101 for forming thin-film transistors. Here, the nitride-based insulating layer 103 may improve screen display characteristics by blocking a color generated from an electrode line made of a metal material such as copper (Cu), for example, yellow, so that yellow is not displayed. That is, when a flip structure is applied, a pixel display surface is changed to the thin-film transistor substrate 101 (instead of the color filter substrate as in the related art technology), and thus the nitride-based insulating layer 103 is formed below metal lines to improve the reflective luminosity of the metal lines.

Further, on the insulating layer 103, a large-area common electrode 105 is formed. The common electrode 105 is formed in the shape of a large-area plate.

Furthermore, a plurality of gate lines and data lines 113 that are respectively unidirectionally extended and that are spaced apart from each other in parallel are formed on the upper substrate 101.

Also, a thin-film transistor T composed of a gate electrode 107, an active layer 109, an ohmic contact layer 111, a source electrode 113a, and a drain electrode 113b is formed at each of crossing points of the gate lines and the data lines 113. At this time, a gate insulating layer 108 covering the gate electrode 107 is formed on the nitride-based insulating layer 103.

Further, touch lines 115 are formed over the upper substrate 101 in parallel to the data lines 113. Here, the data lines 113 and the touch lines 115 are alternately arranged in a Double Rate Driving (DRD) form.

Then, a protective layer 119 is formed on an entire surface of the substrate including the thin-film transistor T. Further, a drain contact hole for exposing a portion of the drain electrode 113b, and a common electrode contact hole and a touch line contact hole for respectively exposing a portion of the common electrode 105 and a portion of the corresponding touch line 115 are formed in the protective layer 119.

Also, on the protective layer 119, the pixel electrodes 125 and coupling lines 127 are formed, wherein each of the pixel electrodes 125 overlaps the common electrode 105 and is electrically coupled with the drain electrode 113b through the drain contact hole, and wherein each of the coupling lines 127 electrically couples the common electrode 105 with the touch line 115 through the common electrode contact hole and the touch line contact hole.

Then, an upper alignment layer is formed on an entire surface of the protective layer 119 including the pixel electrodes 125 and the coupling lines 127.

Meanwhile, the black matrix 153 for blocking the transmission of light to an area other than the pixel areas is formed on the lower substrate 151.

Further, the red, green, and blue color filters 155 are formed in the pixel areas of the lower substrate 151. Here, the black matrix 153 is formed on the lower substrate 151 between the red, green and blue color filters 155.

Furthermore, ITO may be additionally formed on a rear surface of the lower substrate 151 and may then be used for ESD prevention, thus enhancing ESD prevention characteristics.

Meanwhile, when the upper substrate 101 and the lower substrate 151 are attached to each other, the black matrix 153 is arranged to overlap an area other than the pixel areas of the upper substrate 101, for example, an area above the thin-film transistor T, the gate line, and the data line 113.

A lower alignment layer that enables liquid crystal to be aligned in a certain direction is formed on the rear surface of the lower substrate 151.

When a data signal is supplied to the pixel electrode 125 through the thin-film transistor T, a fringe field is formed between the large-area common electrode 105, to which a common voltage is supplied, and the pixel electrode 125, so that liquid crystal molecules aligned horizontally between the upper substrate 101 and the lower substrate 151 rotate due to dielectric anisotropy. Accordingly, the transmittance of light that passes through the pixel area changes depending on the degree of rotation of the liquid crystal molecules, thus enabling gray scale (gradation) to be realized.

In this way, the borderless in-cell touch LCD device according to the present disclosure may implement a screen display and a screen touch through the upper substrate 101 for formation of thin-film transistors, which has an area larger than that of the lower substrate 151 for formation of the color filters, thus improving touch performance and ESD performance.

Further, the present disclosure may implement a screen display and a screen touch through the upper substrate 101 for formation of thin-film transistors, which has an area larger than that of the lower substrate 151 for formation of the color filters, thus improving touch performance and ESD performance.

In the present disclosure, a distance between a finger 171 and the common electrode 105 is decreased, and a finger capacitance C2 therebetween is increased, so that finger sensitivity may be increased. A contact area on the common electrode 105 is increased, so that touch sensitivity may be increased when a finger touch is sensed.

Furthermore, in the present disclosure, the resistance of the touch line 115 is decreased due to a decrease in capacitance between the touch line 115 and the pixel electrode 125, thus enabling touch sensitivity to be improved.

Figure 6:
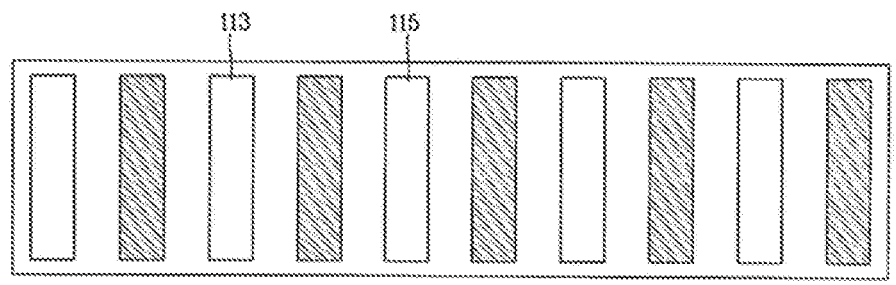
FIG. 6 is a diagram schematically illustrating a structure in which data lines and touch lines of the borderless in-cell touch LCD device according to an embodiment of the present disclosure are arranged in an alternating (DRD) form.

FIG. 6 is a diagram schematically illustrating a structure in which data lines and touch lines of the borderless in-cell touch LCD device are alternately arranged in a DRD form according to an embodiment of the present disclosure.

Referring to FIG. 6, the in-cell touch LCD device according to an embodiment of the present disclosure employs an Advanced High In-Plane Switching DRD (AH IPS DRD) structure, wherein the data lines 113 and the touch lines 115 are formed on the upper substrate 101 in an alternating (Double Rate Driving: DRD) structure, that is, a structure in which they alternate with each other.

A mask manufacturing process for the borderless in-cell touch LCD device according to the present disclosure, having the above configuration, will be schematically described below with reference to FIG. 7.

Figure 7:
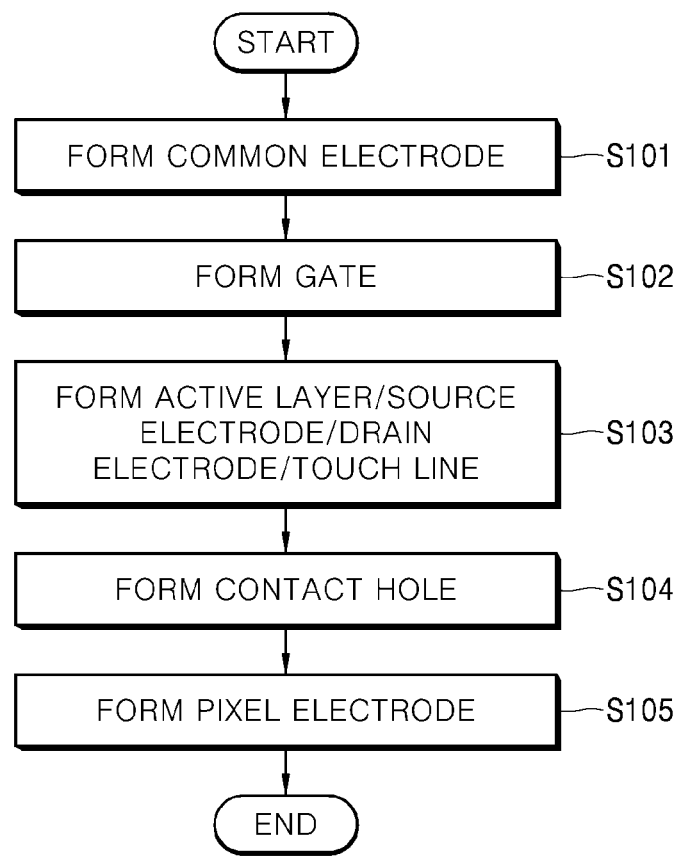
FIG. 7 is a flowchart illustrating a mask manufacturing process for the borderless in-cell touch LCD device according to an embodiment of the present disclosure.

FIG. 7 is a flowchart illustrating a mask manufacturing process for the borderless in-cell touch LCD device according to the present disclosure.

Referring to FIG. 7, the mask manufacturing process for the borderless in-cell touch LCD device according to the present disclosure includes a first mask process S101 of forming a common electrode on an upper substrate for formation of thin-film transistors, a second mask process S102 of forming a gate electrode on the upper substrate including the common electrode, a third mask process S103 of forming an active layer, a source electrode, a drain electrode, and a touch line on the upper substrate including the gate electrode, a fourth mask process S104 of forming a drain contact hole for exposing the drain electrode and forming a common electrode contact hole and a touch line contact hole for respectively exposing the common electrode and the touch line in a protective layer that covers the source electrode, the drain electrode, and the touch line, and a fifth mask process S105 of forming a pixel electrode that is coupled to the drain electrode and a coupling line that is coupled to the common electrode and the touch line, on the protective layer.

Also, the mask manufacturing process for the borderless in-cell touch LCD device according to the present disclosure may include a mask process of forming a black matrix on the lower substrate for formation of color filters, and a mask process of forming color filters on the lower substrate between areas defined by the black matrix.

In this way, the borderless in-cell touch LCD device according to the present disclosure may omit an existing mask process of forming a touch line by forming the touch line at the same time that the active layer, the source electrode, and the drain electrode are formed, and may omit an existing mask process of forming a touch line contact hole by forming the touch line contact hole at the same time that the drain contact hole is formed, thus reducing the number of masks in manufacturing processes, which was needed in the related art technology.

Meanwhile, a method of manufacturing a borderless in-cell touch LCD device according to the present disclosure will be described below with reference to FIGS. 8A to 8H.

FIGS. 8A to 8H are sectional views illustrating a process of manufacturing the borderless in-cell touch LCD device according to the present disclosure.

Figure 9:
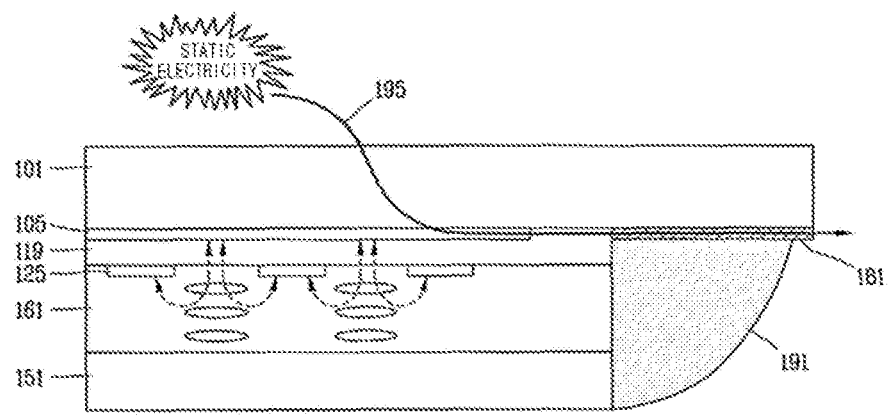
FIG. 9 is a diagram schematically illustrating an ESD path of the borderless in-cell touch LCD device according to an embodiment of the present disclosure.

FIG. 9 is a diagram schematically illustrating an ESD path of the borderless in-cell touch LCD device according to the present disclosure.

The borderless LCD device according to the present disclosure is characterized in that a thin-film transistor substrate is implemented as an upper substrate 101, and a color filter substrate is implemented as a lower substrate 151. That is, the borderless LCD device according to the present disclosure is characterized in that, unlike related art technology, the upper substrate having a relatively large area is disposed over the lower substrate. Here, on the upper substrate 101, thin-film transistors, which are switching elements, and various types of lines and electrodes are formed to define pixel areas.

Figure 8A:
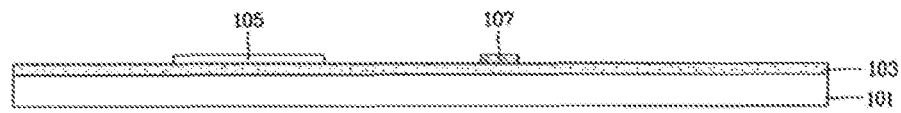
FIGS. 8A to 8H are sectional views illustrating a process of manufacturing the borderless in-cell touch LCD device according to an embodiment of the present disclosure.

First, as illustrated in FIG. 8A, a nitride layer 103 is deposited on an entire surface of a transparent upper substrate 101 on which a plurality of unit pixel areas are defined. Here, the nitride layer 103 may be made of any one selected from among nitride-based insulating materials.

Here, the nitride layer 103 may improve screen display characteristics by blocking the display of a color generated from an electrode line made of a metal material such as copper (Cu), for example, yellow, so that the yellow is not displayed. That is, when a flip structure is applied, a pixel display surface is changed to the upper substrate 101 (instead of the lower substrate as in the related art technology), and thus the nitride-based insulating layer 103 is formed below metal lines to improve the reflective luminosity of the metal lines.

Next, after a first transparent conductive material layer is formed on the nitride layer 103, a large-area plate-shaped common electrode 105 is formed on the nitride layer 103 by etching the first transparent conductive material layer using photolithography technology. Here, as the material of the first transparent conductive layer, any one material selected from the group consisting of transparent materials including Indium Tin Oxide (ITO) and Indium Zinc Oxide (IZO) is used.

Next, after a first metal layer is deposited on the upper substrate 101 including the common electrode 105 using a sputtering method, a gate line and a gate electrode 107 vertically extended from the gate line are formed by etching the first metal layer using photolithography technology. Here, as the material of the first metal layer, at least one material selected from the group consisting of conductive metal materials including aluminum (Al), tungsten (W), copper (Cu), molybdenum (Mo), chrome (Cr), titanium (Ti), moly-tungsten (MoW), moly-titanium (MoTi), and copper/moly-titanium (Cu/MoTi) is used.

Figure 8B:
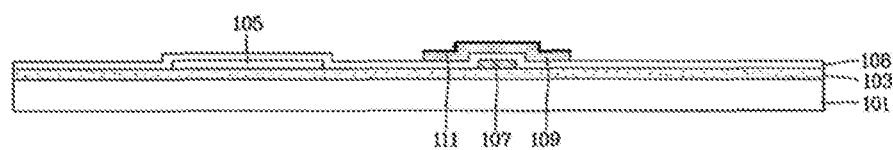

Thereafter, as illustrated in FIG. 8B, a gate insulating layer 108 is deposited on the nitride layer 103 including the gate electrode 107 and the common electrode 105. Here, the gate insulating layer 108 is made of an insulating material such as silicon nitride (SiNx) or silicon oxide (SiO$_2$).

Next, an amorphous silicon layer (a-Si:H) and an amorphous silicon layer doped with impurities (n+ or p+) are sequentially stacked on the gate insulating layer 108. In this regard, the amorphous silicon layer (a-Si:H) and the amorphous silicon layer doped with impurities (n+ or p+) may be deposited using a Chemical Vapor Deposition (CVD) method or other deposition methods.

Then, an active layer 109 and an ohmic contact layer 111 are formed on the gate insulating layer 108 formed on the gate electrode 107 by selectively etching the amorphous silicon layer (a-Si:H) and the amorphous silicon layer doped with impurities (n+ or p+) using photolithography technology.

Figure 8C:
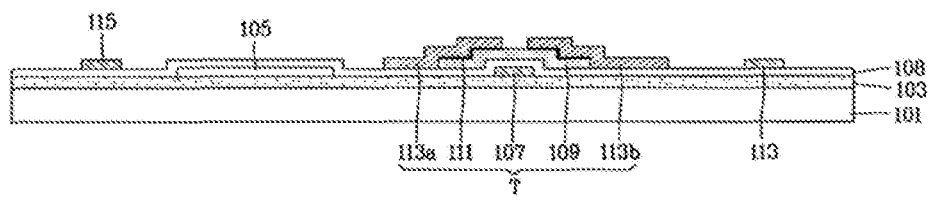

Next, as illustrated in FIG. 8C, a second metal layer covering both the active layer 109 and the ohmic contact layer 111 is formed on the gate insulating layer 108. Here, as the material of the second metal layer, at least one material selected from the group consisting of conductive metal materials including aluminum (Al), tungsten (W), copper (Cu), molybdenum (Mo), chrome (Cr), titanium (Ti), moly-tungsten (MoW), moly-titanium (MoTi), and copper/moly-titanium (Cu/MoTi) is used.

Next, together with a data line 113 arranged to cross the gate line, a source electrode 113a extended from the data line 113, and a drain electrode 113b spaced apart from the source electrode 113a are formed by selectively etching the second metal layer using photolithography technology. In this regard, when the source electrode 113a and the drain electrode 113b are formed, a portion of the ohmic contact layer 111 below them is also etched, and thus the source electrode 113a and the drain electrode 113b are separated from each other with respect to a channel area of the active layer 109.

Further, the touch line 115 arranged in parallel to the data line 113 to alternate with the data line 113 is formed at the same time that the data line 113 is formed.

Figure 8D:
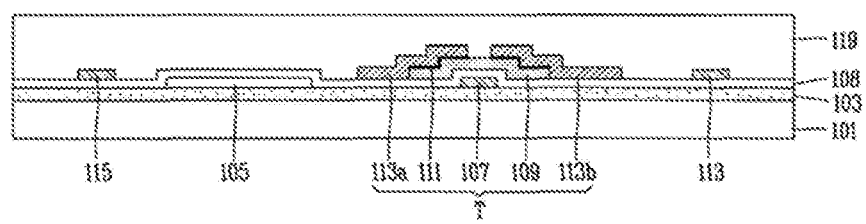

Thereafter, as illustrated in FIG. 8D, a protective layer 119 made of silicon nitride (SiNx) or silicon oxide (SiO$_2$) that is an inorganic insulating material is formed on the substrate including the source electrode 113a and the drain electrode 113b.

Figure 8E:
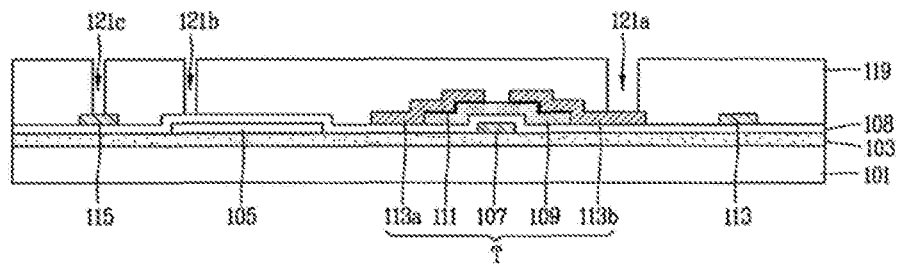

Then, as illustrated in FIG. 8E, a drain contact hole 121a for exposing a portion of the drain electrode 113b and a common electrode contact hole 121b and a touch line contact hole 121c for exposing the common electrode 105 and the touch line 115, respectively, are simultaneously formed by selectively etching the protective layer 119 using photolithography technology.

Figure 8F:
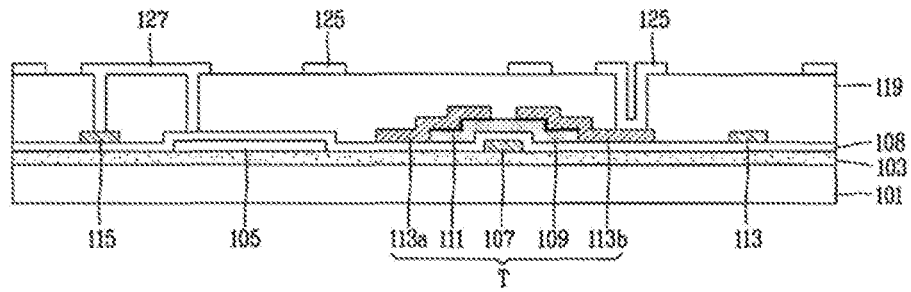

Next, as illustrated in FIG. 8F, after a second transparent conductive material layer is formed on the protective layer 119, a plurality of pixel electrodes 125 and coupling lines 127 are formed on the protective layer 119 by etching the second transparent conductive material layer using photolithography technology. In this regard, as the material of the transparent conductive material layer, any one material selected from the group consisting of transparent materials including Indium Tin Oxide (ITO) and Indium Zinc Oxide (IZO) is selected.

Next, each pixel electrode 125 is electrically coupled with the drain electrode 113b through the drain contact hole 121a, and each coupling line 127 electrically couples the common electrode 105 with the touch line 115 through the common electrode contact hole 121b and the touch line contact hole 121c.

Further, an upper alignment layer is formed on the protective layer 119 including the pixel electrodes 125 and the coupling lines 127, and thus the process of manufacturing the upper substrate for formation of the thin-film transistor array of the in-cell touch LCD device according to the present disclosure is completed.

Figure 8G:
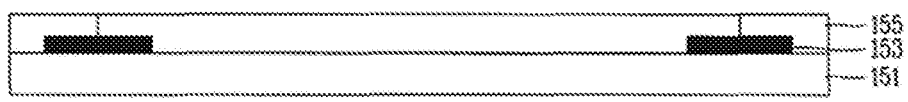

Thereafter, as illustrated in FIG. 8G, a black matrix (BM) 153 is formed on the lower substrate 151 attached to the thin-film transistor substrate, that is, the upper substrate 101, while being spaced apart from the upper substrate 101, in order to block light from being transmitted to an area other than pixel areas.

Next, red, green, and blue color filters 155 are formed in the pixel areas of the lower substrate 151. Here, the black matrix 153 is disposed on the color filter array substrate 151 between the red, green, and blue color filters 155.

Thereafter, when the lower substrate 151 is attached to the upper substrate 101, the black matrix 153 is arranged to overlap an area other than the pixel areas of the upper substrate 101, for example, an area above the thin-film transistor T, the gate line, and the data line 113.

An upper alignment layer is formed on the color filters 155 in order to align liquid crystal in a certain direction, and thus the process of manufacturing the lower substrate is completed.

Figure 8H:
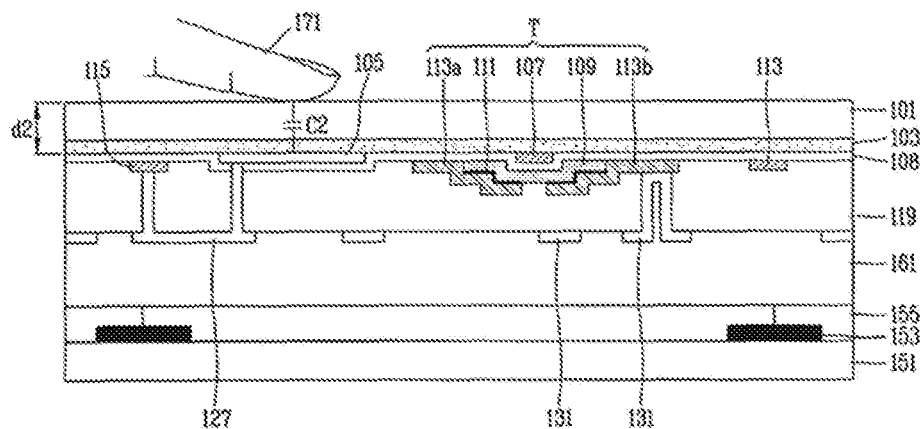

Next, as illustrated in FIG. 8H, a liquid crystal layer 161 is formed between the upper substrate 101 and the lower substrate 151, and thus the in-cell touch LCD device according to the embodiment of the present disclosure is completely manufactured.

FIG. 9 is a diagram schematically illustrating an electrostatic discharge (ESD) path of the borderless in-cell touch LCD device according to an embodiment of the present disclosure.

Referring to FIG. 9, in the in-cell touch LCD device according to an embodiment of the present disclosure, a discharge path 195 for static electricity that is externally produced is implemented through the common electrode 105 and a ground line 181 of a printed circuit board (PCB) coupled with the common electrode 105.

Meanwhile, an in-cell touch LCD device according to other embodiments of the present disclosure will be described below with reference to FIGS. 10 and 11.

Figure 10:
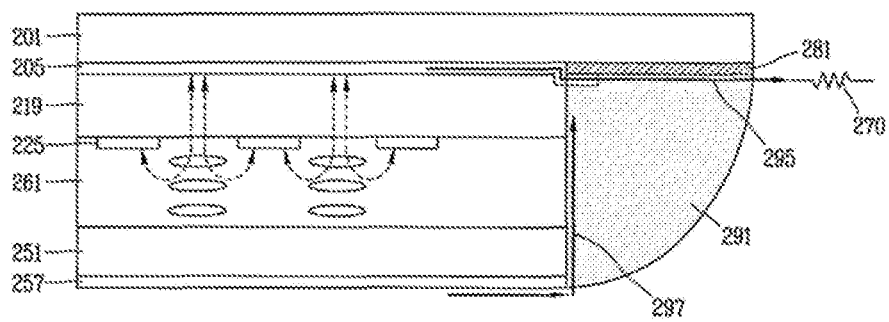
FIG. 10 is a sectional view schematically illustrating a borderless in-cell touch LCD device according to other embodiments of the present disclosure.

FIG. 10 is a sectional view schematically illustrating a borderless in-cell touch LCD device according to other embodiments of the present disclosure.

Figure 11:
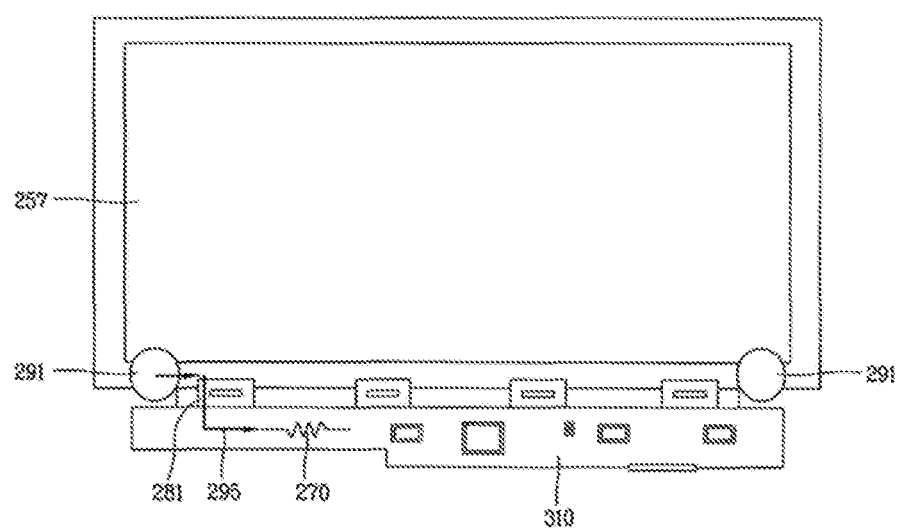
FIG. 11 is a diagram schematically illustrating an ESD path of the borderless in-cell touch LCD device according to other embodiments of the present disclosure.

FIG. 11 is a diagram schematically illustrating an ESD path of the borderless in-cell touch LCD device according to other embodiments of the present disclosure.

Referring to FIGS. 10 and 11, the structure of the borderless in-cell touch LCD device according to the other embodiments of the present disclosure is almost identical to that of the borderless in-cell touch LCD device according to the embodiment of the present disclosure, and there is only a difference between the embodiments in that a resistor 270 having several tens of kΩ is additionally coupled to a PCB coupled to the in-cell touch LCD device.

When the borderless in-cell touch LCD device according to the other embodiments of the present disclosure will be described below with reference to FIGS. 10 and 11. A thin-film transistor substrate is implemented as an upper substrate 201, and a color filter substrate is implemented as a lower substrate 251. That is, unlike a related art structure, the in-cell touch LCD device according to the present disclosure is characterized that the upper substrate having a relatively large area is disposed over the lower substrate. Here, on the upper substrate 201, thin-film transistors, which are switching elements, and various types of lines and electrodes are formed to define pixel areas.

Further, a color filter layer for displaying three primary colors such as red (R), green (G), and blue (B), and a black matrix (BM) for partitioning individual pixel areas may be formed on the lower substrate 251. A lower polarizing plate is formed on an outer surface of the lower substrate 251.

That is, a plurality of gate lines (not illustrated) and data lines that are horizontally and vertically arranged and that define a plurality of pixel areas, thin-film transistors that are switching elements formed in crossing regions of the gate lines and the data lines, and pixel electrodes 225 that are formed in the pixel areas may be formed on the upper substrate 201.

Further, when the LCD device is a vertical electric field type, such as a Twisted Nematic (TN) type, a common electrode is formed on the lower substrate 251, whereas when the LCD device is a horizontal electric field type, such as an In-Plane Switching (IPS) or Fringe-Field Switching (FFS) type, the pixel electrodes 225, together with a common electrode 205, may be formed on the upper substrate 201.

Also, on the upper substrate 201, the large-area common electrode 205 is formed. The common electrode 205 is formed in the shape of a large-area plate.

Furthermore, a plurality of gate lines and data lines that are respectively unidirectionally extended and that are spaced apart from each other in parallel are formed on the upper substrate 201.

Furthermore, thin-film transistors are formed at crossing points of the gate lines and the data lines.

On the upper substrate 201, touch lines are formed in parallel to the data lines (not illustrated). Here, the data lines and the touch lines are alternately arranged in a Double Rate Driving (DRD) form.

Then, a protective layer 219 is formed on an entire surface of the substrate including the thin-film transistor. Further, a drain contact hole for exposing a portion of a drain electrode, and a common electrode contact hole and a touch line contact hole for respectively exposing a portion of the common electrode 205 and a portion of the touch line are formed in the protective layer 219.

Also, on the protective layer 219, the pixel electrodes 225 and coupling lines are formed, wherein each of the pixel electrodes 225 overlaps the common electrode 205 and is electrically coupled with the drain electrode through the drain contact hole, and wherein each of the coupling lines electrically couples the common electrode 205 with the touch line through the common electrode contact hole and the touch line contact hole.

Then, an upper alignment layer is formed on an entire surface of the protective layer 219 including the pixel electrodes 225 and the coupling lines.

Meanwhile, the black matrix for blocking the transmission of light to an area other than the pixel areas is formed on the lower substrate 251.

Further, the red, green, and blue color filters are formed in the pixel areas of the lower substrate 251. Here, the black matrix is formed on the lower substrate 251 between the red, green and blue color filters.

Meanwhile, when the upper substrate 201 and the lower substrate 251 are attached to each other, the black matrix is arranged to overlap an area other than the pixel areas of the upper substrate 201, for example, an area above the thin-film transistor, the gate line, and the data line.

Further, a lower alignment layer that enables liquid crystal to be aligned in a certain direction is formed on the rear surface of the lower substrate 201.

Meanwhile, the resistor 270 is additionally provided on a ground line 281 that is provided on a PCB 310 coupled with a circuit unit disposed on the upper substrate 201.

Furthermore, a silver dotting part 291 is formed on side surfaces of the upper substrate 201 and the lower substrate 251 and is then coupled to the ground line 281. Here, an external ESD path 295 is formed through the common electrode 205 and the ground line 281.

Furthermore, a transparent conductive layer 257 made of ITO is additionally formed on the rear surface of the lower substrate 251. Here, since ITO may be applied to prevent ESD, ESD prevention properties may be improved. In this case, an external ESD path 297 is formed through the transparent conductive layer 257, the silver dotting part 291, and the ground line 281.

In this way, when a data signal is supplied to the pixel electrode 225 through the thin-film transistor, a fringe field is formed between the large-area common electrode 205, to which a common voltage is supplied, and the pixel electrode 225, so that liquid crystal molecules aligned horizontally between the upper substrate 201 and the lower substrate 251 rotate due to dielectric anisotropy. Accordingly, the transmittance of light that passes through the pixel area changes depending on the degree of rotation of the liquid crystal molecules, thus enabling gray scale (gradation) to be realized.

As described above, the in-cell touch LCD device according to the present disclosure may implement a screen display and a screen touch through the thin-film transistor substrate, which has an area larger than that of the color filter substrate, thus improving touch performance and ESD performance.

Further, the present disclosure is advantageous in that a high-resistance conductive layer, which was used to make a touch in related art technology, may be removed by employing a four-side borderless configuration/design, thus simplifying a manufacturing process and reducing manufacturing costs.

Furthermore, the present disclosure is advantageous in that a nitride-based insulating material is additionally provided between a thin-film transistor substrate and a gate line, so that a phenomenon in which a color produced from an electrode line made of a metal material, such as copper (Cu), is displayed may be prevented, thus improving screen display characteristics.

Furthermore, the present disclosure is advantageous in that ITO may be additionally formed on a rear surface of a color filter substrate and may be used for ESD prevention, thus improving ESD prevention characteristics.

The present disclosure is advantageous in that finger capacitance between a finger and a common electrode is increased due to a decrease in a distance therebetween, thus improving finger sensitivity, and in that a contact area of the common electrode is increased, thus improving touch sensitivity when a finger touch is sensed.

Further, the present disclosure is advantageous in that a resistor is added to a ground line on a printed circuit board coupled to an ESD path of a panel, so that, even if ITO is applied to the rear surface of the color filter substrate, touch performance may be ensured and ESD characteristics may be improved.

Furthermore, in the related art technology, touch line resistance is increased due to a structure in which data lines and touch lines are arranged to overlap each other, and a planarization layer should be essentially formed to decrease the touch line resistance. In contrast, the present disclosure employs a flip-type Double Rate Driving (DRD) structure in which a thin-film transistor substrate having an area larger than that of a color filter substrate is arranged on the color filter substrate, that is, a structure in which data lines and touch lines do not overlap each other, so that a process of manufacturing a planarization layer that was formed to prevent touch line resistance from increasing as in the case of the related art technology may be omitted, thus simplifying a manufacturing process and reducing manufacturing costs.

In addition, the present disclosure is advantageous in that an existing mask process of forming a touch line may be omitted by forming the touch line at the same time that the active layer, the source electrode, and the drain electrode are formed, and in that an existing mask process of forming a touch line contact hole may be omitted by forming the touch line contact hole at the same time that the drain contact hole is formed, thus reducing the number of masks in manufacturing processes, which was needed in the related art technology.

As described above, although the embodiments have been described with reference to the attached drawings, the present disclosure is not limited thereto.

It should be understood that the above-described term such as "comprise," "include," or "have" is merely intended to indicate that components or elements or combinations thereof are present, and are not intended to exclude a possibility that one or more other components or elements or combinations thereof will be present or added. Unless differently defined, all terms used here including technical or scientific terms have the same meanings as the terms generally understood by those skilled in the art to which the present disclosure pertains. The terms identical to those defined in generally used dictionaries should be interpreted as having meanings identical to contextual meanings of the related art, and are not interpreted as being ideal or excessively formal meanings unless they are definitely defined in the present specification.

As described above, the in-cell touch LCD device according to the present disclosure may implement a screen display and a screen touch through the thin-film transistor substrate, which has an area larger than that of the color filter substrate, thus improving touch performance and ESD performance.

Further, the present disclosure is advantageous in that a high-resistance conductive layer, which was used to make a touch in the related art technology, may be removed by employing a four-side borderless configuration/design, thus simplifying a manufacturing process and reducing manufacturing costs.

Furthermore, the present disclosure is advantageous in that a nitride-based insulating material is additionally provided between a thin-film transistor substrate and a gate line, so that a phenomenon in which a color produced from an electrode line made of a metal material, such as copper (Cu), is displayed may be prevented, thus improving screen display characteristics.

Furthermore, the present disclosure is advantageous in that ITO may be additionally formed on a rear surface of a color filter substrate and may be used for ESD prevention, thus improving ESD prevention characteristics.

The present disclosure is advantageous in that finger capacitance between a finger and a common electrode is increased due to a decrease in a distance therebetween, thus improving finger sensitivity, and in that a contact area of the common electrode is increased, thus improving touch sensitivity when a finger touch is sensed.

Further, the present disclosure is advantageous in that a resistor is added to a ground line on a printed circuit board coupled to an ESD path of a panel, so that, even if ITO is applied to the rear surface of the color filter substrate, touch performance may be ensured and ESD characteristics may be improved.

Furthermore, in the related art technology, touch line resistance is increased due to a structure in which data lines and touch lines are arranged to overlap each other, and a planarization layer should be essentially formed to decrease the touch line resistance. However, the present disclosure employs a flip-type Double Rate Driving (DRD) structure in which a thin-film transistor substrate having an area larger than that of a color filter substrate is arranged on the color filter substrate, that is, a structure in which data lines and touch lines do not overlap each other, so that a process of manufacturing a planarization layer that was formed to prevent touch line resistance from increasing as in the case of the related art technology may be omitted, thus simplifying a manufacturing process and reducing manufacturing costs.

In addition, the present disclosure is advantageous in that an existing mask process of forming a touch line may be omitted by forming the touch line at the same time that the active layer, the source electrode, and the drain electrode are formed, and in that an existing mask process of forming a touch line contact hole may be omitted by forming the touch line contact hole at the same time that the drain contact hole is formed, thus reducing the number of masks in manufacturing processes, which was needed in the related art technology.

The above description is merely intended to illustratively describe the technical spirit of the present disclosure, and those skilled in the art to which the present disclosure pertains may implement various changes and modifications without departing from the essential features of the present disclosure. Therefore, the embodiments disclosed in the present disclosure are merely intended to describe the present disclosure, rather than limiting the technical spirit of the present disclosure, and the scope of the technical spirit of the present disclosure is not limited by these embodiments. The scope of the present disclosure should be defined by the accompanying claims and all technical spirit of the accompanying claims and equivalents thereof should be construed as being included in the scope of the present disclosure.

What is claimed is:

1. An in-cell touch liquid crystal display device, comprising:
    a lower substrate;
    an upper substrate disposed over the lower substrate to face the lower substrate, the upper substrate forming a display surface of the display device and having an area larger than that of the lower substrate;
    a common electrode provided under the upper substrate;
    a gate line and a data line provided under the upper substrate and disposed to cross each other to define a pixel area;
    a touch line disposed under the upper substrate in parallel to the data line;
    a thin-film transistor provided at a crossing point of the gate line and the data line;
    a protective layer provided under the upper substrate including the thin-film transistor, and configured to expose a portion of a drain electrode of the thin-film transistor and a portion of each of the touch line and the common electrode;
    a pixel electrode provided under the protective layer and coupled to the drain electrode; and
    a coupling line coupled to the touch line and the common electrode.

2. The in-cell touch liquid crystal display device of claim 1, further comprising:
    a nitride-based insulating layer provided under the upper substrate above the common electrode.

3. The in-cell touch liquid crystal display device of claim 1; wherein the common electrode is formed in a shape of a large-area plate.

4. The in-cell touch liquid crystal display device of claim 1, wherein the common electrode is formed over an entire surface of a pixel area formed while the gate line and the data line cross each other.

5. The in-cell touch liquid crystal display device of claim 1, wherein the lower substrate is a color filter substrate, and the upper substrate is a thin-film transistor substrate.

6. The in-cell touch liquid crystal display device of claim 1, wherein an electrostatic discharge path is formed through the common electrode and a ground line of a printed circuit board coupled to the common electrode.

7. The in-cell touch liquid crystal display device of claim 6, further comprising:
    a resistor provided on the ground line of the printed circuit board that forms the electrostatic discharge path.

8. The in-cell touch liquid crystal display device of claim 1, further comprising:
    a transparent conductive layer provided on a rear surface of the lower substrate.

9. The in-cell touch liquid crystal display device of claim 8, wherein an electrostatic discharge path is formed through the transparent conductive layer, a silver dotting part, and a ground line.

10. A method for providing an in-cell touch liquid crystal display device, the method comprising:
    providing a lower substrate, and an upper substrate having an area larger than that of the lower substrate;
    forming a common electrode over the upper substrate;
    forming a gate line and a data line disposed to cross each other to define a pixel area over the upper substrate;
    forming a touch line disposed in parallel to the data line over the upper substrate;
    forming a thin-film transistor at a crossing point of the gate line and the data line;
    forming a protective layer, configured to expose a portion of a drain electrode of the thin-film transistor and a portion of each of the touch line and the common electrode, over the upper substrate including the thin-film transistor;
    forming a pixel electrode coupled to the drain electrode over the protective layer;
    forming a coupling line coupled to the touch line and the common electrode; and
    attaching the upper substrate onto the lower substrate to face the lower substrate,
    wherein the upper substrate forms a display surface of the display device.

11. The method of claim 10, further comprising:
    forming a nitride-based insulating layer over the upper substrate below the common electrode.

12. The method of claim 10, wherein the common electrode is formed in a shape of a large-area plate.

13. The method of claim 10, wherein the common electrode is formed over an entire surface of a pixel area formed while the gate line and the data line cross each other.

14. The method of claim 10, wherein the lower substrate is a color filter substrate, and the upper substrate is a thin-film transistor substrate.

15. The method of claim 10, wherein an electrostatic discharge path is formed through the common electrode and a ground line of a printed circuit board coupled to the common electrode.

16. The method of claim 15, further comprising:
    providing a resistor on the ground line of the printed circuit board that forms the electrostatic discharge path.

17. The method of claim 10; further comprising:
    forming a transparent conductive layer over a rear surface of the lower substrate.

18. The method of claim 17, wherein an electrostatic discharge path is formed through the transparent conductive layer, a silver dotting part, and a ground line.

19. The method of claim 10, wherein the forming of the pixel electrode coupled to the drain electrode over the protective layer and the forming of the coupling line coupled to the touch line and the common electrode are simultaneously performed through an identical mask process.

20. The method of claim 10, wherein the forming of the data line and the forming of the touch line disposed in parallel to the data line over the upper substrate are simultaneously performed through an identical mask process.

* * * * *